United States Patent [19]

Hannaford et al.

[11] 3,984,793
[45] Oct. 5, 1976

[54] HIGH FREQUENCY ATTENUATOR

[75] Inventors: David Arthur Hannaford, Beaverton; Cornelis Teunis Veenendaal, Cornelius; Valdis Egils Garuts, Beaverton, all of Oreg.

[73] Assignee: Tektronix, Inc., Beaverton, Oreg.

[22] Filed: Nov. 20, 1975

[21] Appl. No.: 633,741

Related U.S. Application Data

[63] Continuation of Ser. No. 438,961, Feb. 4, 1974, abandoned.

[52] U.S. Cl. ............................. 333/81 A; 333/84 M
[51] Int. Cl.² ........................................... H01P 1/22
[58] Field of Search ........................ 333/81 R, 81 A

[56] References Cited
UNITED STATES PATENTS

| | | | |
|---|---|---|---|
| 3,144,625 | 8/1964 | Blonder | 333/81 R |
| 3,740,676 | 6/1973 | Garuts | 333/81 A |
| 3,786,374 | 1/1974 | Bergfried | 333/81 A |

*Primary Examiner*—Paul L. Gensler
*Attorney, Agent, or Firm*—Adrian J. LaRue; Kenneth M. Durk

[57] ABSTRACT

A continuously variable high frequency resistance attenuator is described in which the attenuation is first order independent of frequency. The wave translating media into and out of the attenuator provide a constant characteristic impedance. The attenuator consists of a length of series resistance and a plurality of parallel shunt resistors, which are of adjustable value and extend between the length of series resistance and ground or extend between the length of series resistance and open circuit.

8 Claims, 9 Drawing Figures

HIGH FREQUENCY ATTENUATOR

This is a continuation of application Ser. No. 438,961 filed Feb. 4, 1974, now abandoned.

BACKGROUND OF THE INVENTION

In the prior art, a number of devices for attenuation are taught for use with conventional coaxial and flat strip transmission lines. One such device is described in U.S. Pat. No. 3,157,846 of B. O. Weinschel. The attenuator of the type disclosed in U.S. Pat. No. 3,740,676 of V. E. Garuts, a co-inventor of the present invention, has a greater high frequency response then that taught in U.S. Pat. No. 3,157,846 but is limited in that a lossy distortionless transmission line forming such attenuator has a constant input impedance equal to its characteristic impedance and a constant output impedance equal to one-half of its characteristic impedance.

Another disadvantage of such attenuation devices is that although most can replace any potentiometer, they are of restricted usefulness when employed, say, in the vertical amplifier of a cathode ray oscilloscope having a wide band frequency response from DC to several hundred megahertz.

SUMMARY OF INVENTION

The attenuator of the present invention has a greater high frequency response than the previously mentioned attenuators. The present invention may also be employed in place of conventional type continuously variable attenuators, including potentiometers, in the vertical amplifier of a cathode ray oscilloscope having a wide band frequency response. In addition, it can be used in the non-active signal path of a cathode ray oscilloscope system having a broad frequency response from DC to several hundred megahertz where attenuation is desired but any attenuation device used in the vertical amplifier of such system would adversly affect a signal applied thereto. Further, the present invention provides a continuously variable resistance attenuator which has constant input and output impedances and provides no signal delay change with change of attenuation.

Basically, the continuously variable resistance attenuator according to the present invention is designed such that the attenuating element forms a distortionless transmission line whereby input impedance and output impedance are equal and constant, and are both independent of frequency and attenuation ratio.

The attenuator consists of a series resistor with input and output connectors. Along the entire length of the series resistor are positioned many shunt parallel resistors. Each parallel resistor is at one end connected to the series resistor and at the other end connected to ground or open circuited, dependent upon the attenuator setting.

The attenuator achieves a constant signal delay over its entire range of attenuation by maintaining a fixed electrical distance between the input connector and the output connector regardless of attenuation.

The unit is constructed in a circular configuration, however, a straight line version is possible.

It is therefore an object of the present invention to provide a new and improved continuously variable high frequency attenuator to overcome the disadvantages of the prior art.

It is another object of the present invention to provide a new and improved continuously variable high frequency attenuator of broad frequency bandwith.

It is yet another object of the present invention to provide a new and improved continuously variable high frequency resistance attenuator having constant impedance.

It is still yet another object of the present invention to provide a new and improved continuously variable high frequency resistance attenuator having constant signal delay over the entire range of attenuation.

It is a further object of the present invention to provide a new and improved continuously variable high frequency resistance attenuator which provides a high degree of attenuation.

The foregoing and numerous other objects, advantages, and inherent functions of the present invention will become apparent as the same is more fully understood from the following description, which describes the present invention; it is to be understood, however, that these embodiments are not intended to be exhausting nor limiting of the invention but is given for purposes of illustration in order that others skilled in the art may fully understand the invention and principles thereof and the manner of applying it in practical use so that they may modify it in various forms, each as may best be suited to the conditions of the particular use.

DETAILED DESCRIPTION OF INVENTION

Figure 1:
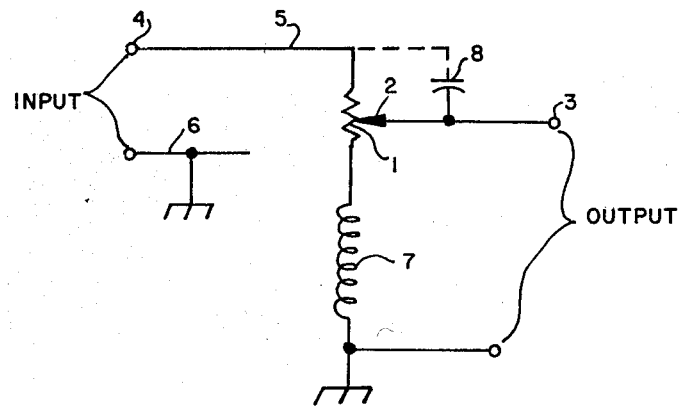
FIG. 1 is a schematic diagram of a prior art variable resistance attenuator.

As shown in FIG. 1, prior art attenuators include a continuously variable resistance potentiometer 1 having its movable contact 2 connected to an output terminal 3. One end terminal of the potentiometer 1 is effectively grounded while its other end terminal is connected to a signal source at the input terminal 4 of the attenuator through the signal conductor 5 of a transmission line. The transmission line includes a ground conductor 6 uniformly spaced from the signal conductor 5 to provide such line with a uniform characteristic impedance. This transmission line 5, 6 enables the signal source connected to input terminal 4 to be positioned remotely from the attenuator potentiometer 1 and such potentiometer also forms as the termination resistor for such transmission line.

The attenuator of FIG. 1 includes a series lead inductance 7 connected between one end of the potentiometer 1 and ground, and a stray capacitance 8 connected between the input end of the potentiometer 1 and movable contact 2, which both cause distortion.

As is well-known, attenuation varies greatly with the frequency of the input signal at high frequencies and is not related to the setting of the movable contact 2 on potentiometer 1. This also prevents the attenuator from properly terminating the transmission line 5, 6 in its characteristic impedance which results in signal reflectors causing distortion of the input signal.

Figure 2:
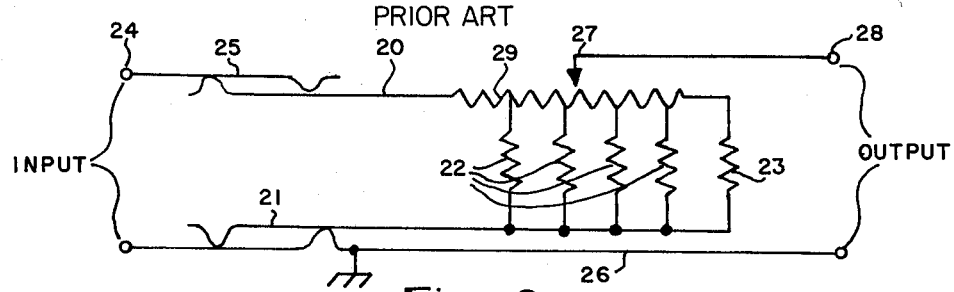
FIG. 2 is a schematic diagram of another prior art variable resistance attenuator.

As shown in FIG. 2, another embodiment of the prior art includes a distortionless lossy transmission line formed by a signal conductor 29 having an attenuation resistance uniformly distributed along its length, a ground conductor 21, and a plurality of separate shunt resistors 22 connected between such signal conductor and ground conductor. The output end of the signal conductor 29 is connected through a termination resistor 23 and ground, such termination resistor having a resistance equal to the characteristic impedance of the transmission line.

The input end of the attenuation resistance is connected to an input terminal 24 through the signal conductor 20 of another transmission line 25, 26. Thus, the signal conductor 20 is uniformly spaced from ground conductor 21 to form a non-lossy type transmission line of uniform characteristic impedance equal to the characteristic impedance of the lossy line 29,22,21. A movable contact 27 slides along the attenuation resistance forming the signal conductor 29 of the lossy transmission line to change the attenuator setting, and is connected to an output terminal 28. In this embodiment, the lossy transmission line section is movable while the input contact and output contact are both fixed and signal transit time of an input signal through the attenuator is constant. The device terminates any transmission line connected to its input since the lossy transmission line forming the attenuator has a constant input impedance equal to its characteristic impedance regardless of the attenuator setting of the output contact. Input and output impedance are not equal, however, and prevents use of such attenuator as an in-line attenuator.

Figure 3:
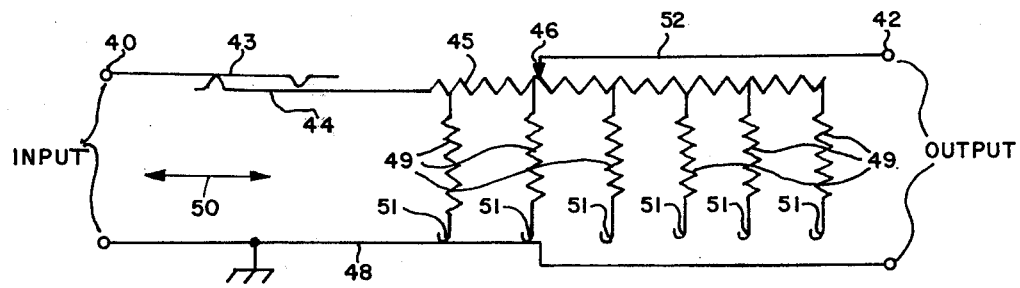
FIG. 3 is a schematic diagram of one embodiment of the continuously variable high frequency resistance attenuator of the present invention.

As shown in FIG. 3, a schematic diagram of one embodiment of the present invention includes a signal input terminal 40 and a signal output terminal 47. Input terminal 40 and output terminal 47 are distantly fixed from one another which allows constant signal delay over the entire range of attenuation as the distance is always maintained constant.

A distortionless transmission line consisting of signal translating mediums 43, 44, 48, and 52 along with resistor element 45 is connected to input terminal 40. Signal translating mediums 43 and 44 are provided with a conventional line stretcher, for moving the atenuator resistance in the direction as indicated by double headed arrow 50.

The attenuator element consists of a series resistor 45 in series with the signal translating mediums 43, 44, and 52. Connected to the series resistor 45 and spaced selectively along the series resistor are disposed a plurality of shunt parallel resistors 49 having one end directly connected to the series resistor and their other end extending like spokes away from the series resistor, and having contact points 51. Contact points 51 move simultaneously in the direction as indicated by double headed arrow 50. As shown in FIG. 3 and previously discussed, the plurality of parallel shunt resistors 49 are in contact with signal translating medium 48, herein after referred to as ground conductor 48, or are open circuited. The attenuator element is such that $$\frac{Rs}{L} = \frac{Gsh}{C}$$

where, $Rs$ is equal to the series resistance per unit length, $L$ is equal to the inductance per unit length, $Gsh$ is equal to the shunt conductance per unit length, and $C$ is equal to the capacitance per unit length. As a result, the input and output impedances are independent of both frequency and attenuation ratio. Further, maximum attenuation ratio is determined by the well-known formula $$\frac{1}{\mu} = \exp\left(\frac{-Rs}{Zo}\right)$$

where $\mu$ is equal to the desired attenuation coefficient and $Rs$ is equal to the series resistance. $Zo$, the characteristic impedance into and out of the attenuator is equal to the square root value of the series resistance multiplied by the parallel resistance or $$Zo = \sqrt{Rs \times Rsh}$$

Figure 4:
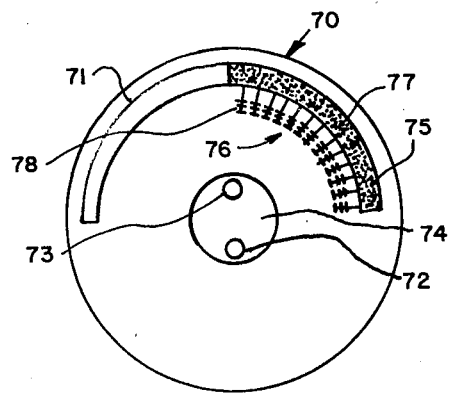
FIG. 4 is a plan view of the attenuator element made in accordance with FIG. 3.

As shown in FIG. 4, the attenuator element of FIG. 3 including series resistor 45, parallel shunt resistors 49 and signal translating medium 44 may be provided as coatings of resistance material and conductive material on a rotor plate 70. As previously mentioned, a circular configuration of the attenuator described is the preferred embodiment but, a straight line version is also possible. Rotor plate 70 is preferably glass but could be any insulating material, such as aluminum oxide ceramic. The rotor is provided with a plurality of off-center annular apertures 72 and 73 in an annular conduction area 74. The rotor is also provided with an arcuate conduction strip 71 coated thereon and spaced inwardly from the periphery of the rotor. The annular conduction area is radially spaced inwardly from the arcuate conduction strip 71. Annular conduction area 74 forms a ground conductor for resistors 49 of FIG. 3. Off center apertures 72 and 73 are provided through which a control means extends for rotation of the rotor plate.

Deposited on a portion of arcuate conduction strip 71 is an arcuate resistance strip 75. Arcuate resistance strip 75 corresponds to the series resistor 45 of FIG. 3, while the portion of arcuate conduction strip 71 free of the deposited arcuate resistance strip 75 corresponds to signal translating medium 44 of FIG. 3. Deposited in such a manner as to make electrical contact to the arcuate resistance strip 75 is a second resistance strip generally indicated by 76. Resistance strip 76 is also arcuate, and, consists of a plurality of separated resistance elements extending like spokes away from the arcuate resistance strip 75. Therefore, resistance strip 76 corresponds to the plurality resistors 49 of FIG. 3.

Deposited on arcuate reistance strip 75 are a plurality of conduction areas 77. Conduction areas 77 are fully described in a co-pending U.S. patent application Ser. No. 438,962 filed Feb. 4, 1974, now abandoned and assigned to the assignee of the present invention.

Deposited on each of the spoke ends of the resistance strip 76 are a plurality of conduction bars 78. Conduction bars 78 correspond to contact points 51 of FIG. 3.

The conduction bars are separately deposited on each spoke end so that adjustment of the parallel resistance can be made. The adjustment technique allows compensation of the attenuator and will be discussed in detail further in the specification.

In the preferred embodiment of the present invention, the rotor 70 was made in accordance with conventional thin film process as follows. A substrate of desired radius has its entire surface metalized with a first suitable resistance material. The entire unit is then photoetched leaving an arcuate strip of the first suitable resistance material as well as an arcuate strip of finger like first suitable resistance material. Next, the entire surface is twice metalized; first using a second suitable resistance material followed by a suitable conduction material. A next photoetch of the conduction material followed by a photoetch of the second resistance material provides the desired element.

Figures 5A, 5B:
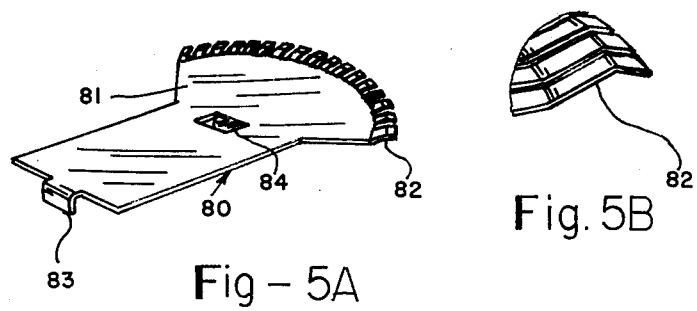
FIG. 5a and 5b are plan views of the attenuator connection member made in accordance with FIG. 3.

Ground connection to annular conduction area 74 of FIG. 4 is provided by a connection member 80 which is shown in FIG. 5a. Connection member 80 is preferably a highly conductive type material and has a fan-shaped area 81. The periphery of fan-shaped area 81 has been slit to provide a plurality of finger contacts 82. Finger contacts 82 are further shaped in a form to provide contact reliability. Such shape or configuration, see FIG. 5b, forms a spring contact which makes electrical connection between the conduction bars 78 of FIG. 4 and the conductor member 80. Also, a part of conduction member 80 are connection tabs 83 and 84. These tabs are provided to secure conduction member 80 to a movable base unit so that contact fingers 82 can be positioned to any one of the plurality of conduction bars 78 of FIG. 4 thereby adjuting the attenuator.

Figure 6:
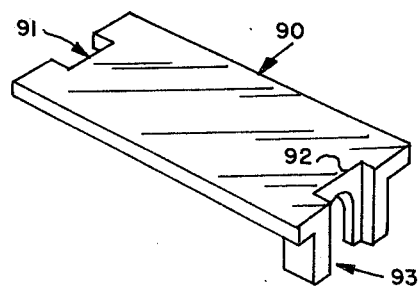
FIG. 6 is a plan view of the attenuator movable base unit made in accordance with FIG. 3.

Referring to FIG. 6 in particular and also FIGS. 5a and 5b, a movable base unit 90 has a first notched end 91 and a second notched end 92. Second notched end 92 further includes a yoke portion 93. Notches 91 and 92 are of the correct depth and width to accept connection tabs 83 and 84 of FIG. 5 which secures the conduction member to the base unit. Yoke portion 93 is placed into a grooved area of an adjustment screw to move the conduction member fingers 82 in accordance with the rotation of such screw. The adjustment technique of the conduction member fingers will be further discussed later in the specification.

The rotor 70, conduction member 80, and movable base unit 90 of FIGS. 4, 5a, and 6, respectively, are each mounted into an annular housing member 100. Annular housing member 100 is shown in prospective drawing FIG. 7 with the various elements also shown.

Housing member 100 is provided with an input connector and an output connector 101 and 102 respectively. It should be noted that input terminal 101 and output terminal 102 may be reversed if desired. Input connector 101 corresponds to signal input terminal 40 of FIG. 3 whereas signal output terminal 47 of FIG. 3 corresponds to output connector 102. Such connectors can be any conventional type coaxial connectors. A first transmission line 103 is provided within the housing member and is connected to the input terminal 101 via an aperture provided therefor. Transmission line 103 corresponds to signal translating medium 43 of FIG. 3. Similarly, a second transmission line 104 is provided within the housing member and is connected to the output terminal 102 via an aperture provided therefor. Transmission line 104 corresponds to signal translating medium 52 of FIG. 3. Transmission lines 103 and 104 are permanently fixed and thus form a stator plate for the rotor 70. Connection between the rotor and the transmission lines is provided by connection tabs 106 and 107 which are part of transmission lines 103 and 104 respectively. Connection tabs 106 and 107 are of the bifurcated type and have a shape similar to the contact fingers 82 of FIG. 5.

Disposed under transmission lines 103 and 104 is an insulating material 105. Insulating material 105 is disposed in an arcuate grooved area 108 in housing member 100 and extends from an inside periphery of the housing well towards its radius center. Disposed beneath insulating material 105 is a spring member 130, clearly shown in FIG. 8. Spring member 130 rests on the bottom of the groove area 108 and maintains constant pressure against insulating material 105, which in turn, keeps transmission lines 103 and 104 in contact with the rotor 70.

Transmission lines 103 and 104 are of the width required to completely cover arcuate conduction strip 71, arcuate resistance strip 75, second arcuate resistance strip 76, and the conduction bars 78 (see FIG. 4). Thus, the impedance of transmission lines 103 and 104 is determined by the insulating material 105, the width of transmission lines 104, 103 and by the spacing between such transmission lines and the spring member 130. The impedance of arcuate conduction strip 71 and arcuate resistance strip 77 is determined largely by the width of strips 71 and 75, and by the distance through air to surface 158 of the housing 100.

A second groove member 109 is also provided in housing member 100. Second groove member 109 is provided with notched edges 119. These edges provide seating of the movable base unit 90 previously described. Also, an adjustment screw 110 having an annular groove 111 is provided within the groove 109. An access aperture is provided within the housing member so that adjustment screw 110 can be rotated, say using a small screwdriver, etc. Annular groove 111 of screw 110 accepts the yoke portion of member 90 and pulls or pushes the movable base unit along the notched edge 109. The aperture through which adjustment screw 110 passes is threaded for obvious reasons.

The housing member 100 for the above described elements of the attenuator is completely enclosed by placing housing cap 112, which is annular in shape, over the housing member 100 and securing the two units together by means of the screws 114.

Housing cap 112 is also provided with a shaft and knob portion 115. The shaft is centered within the housing cap and connected within to a conventional gearing system. Such gearing system is also connected to a second shaft 132. Shaft 132 has a plurality of annular protrusions 134 and 135. Such protrusions pass through apertures provided in and used to drive the rotor 70. The gear system for the preferred embodiment is of the reduction type. For example, if knob and shaft 115 are rotated 300°, rotor 70 turns 90° which corresponds to the full attenuation range of the attenuator.

Figure 7:
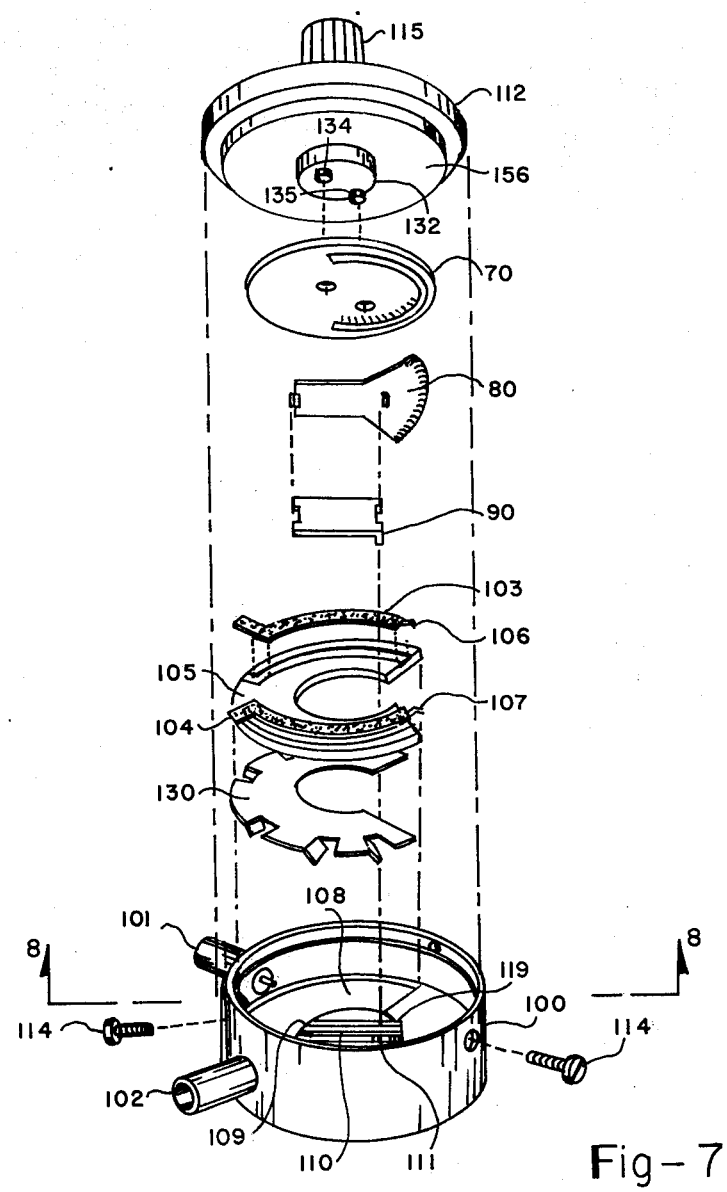
FIG. 7 is a perspective view of the attenuator according to the present invention.
Figure 8:
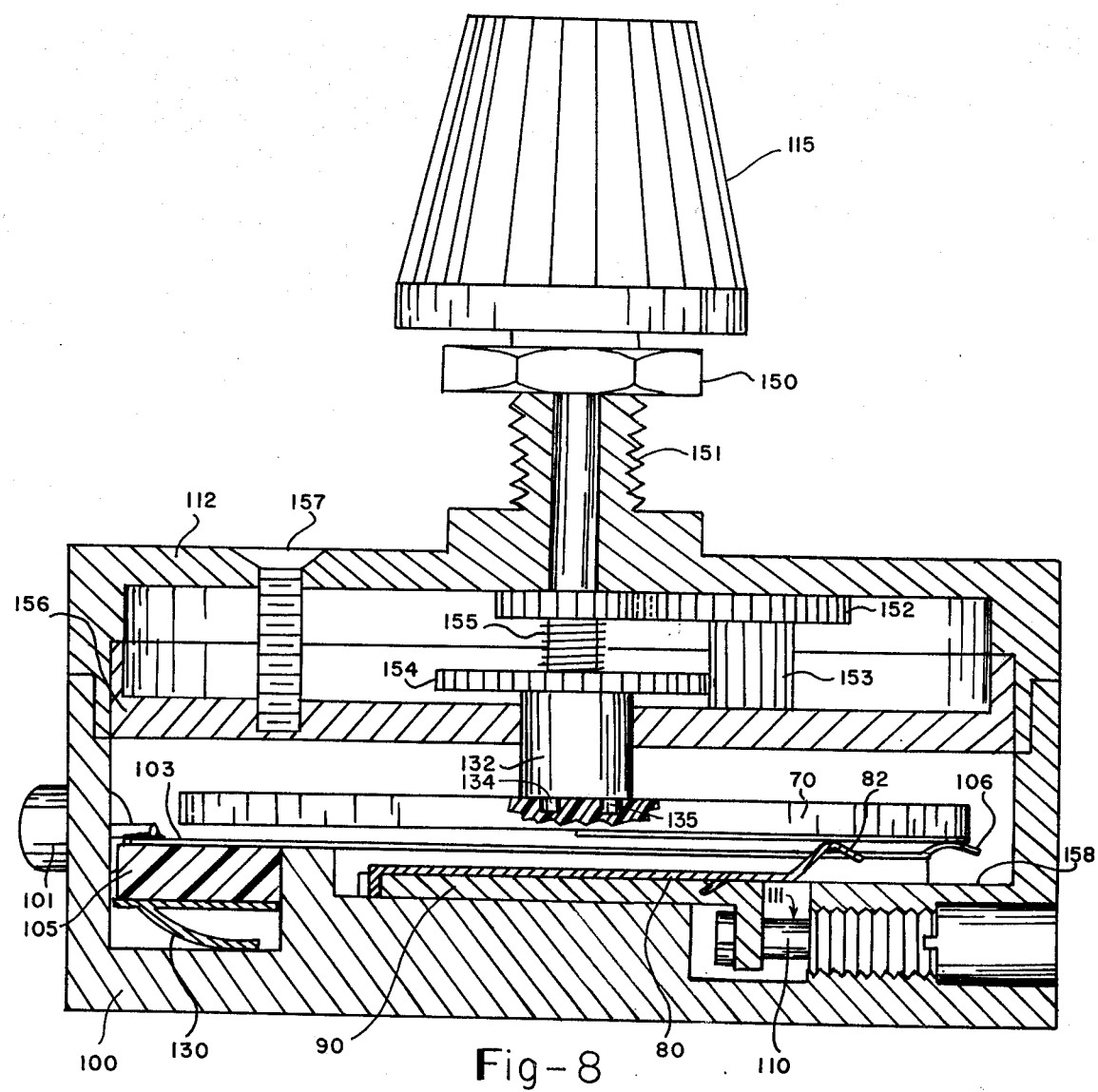
FIG. 8 is a cross-section view of the attenuator taken along the line 8—8 of FIG. 7.

Reference should now be made to FIG. 8 which is a cross section view of the entire attenuator as previously discussed taken along the line 8—8 of FIG. 7. This view also shows a retaining nut 150 on a threaded mounting portion 151 for mounting the attenuator to an apparatus frame or the like.

The gear assembly consists of gears 152, 153, and 154, and a spring member 155. As previously stated, this is a conventional reduction gear assembly and will therefore not be discussed further. It should be noted, however, that spring member 155 is also used to hold the rotor 70 in contact with the transmission lines. A housing cap cover 156 is secured to housing cap 112 with a securing screw 157.

While there has been shown and described the preferred embodiment of the present invention, it will be apparent to those skilled in the art that many changes and modifications may be made without departing from the invention in its broader aspects. For example, although an unbalanced structure has been described, a balanced line version can also be constructed by using two of the described structures back to back. In addition, the present invention could include an off-on switch to provide an off-on switch and attenuator combination. Therefore, the appended claims are intended to cover all such changes and modifications that fall within the true spirit and scope of the invention.

We claim:

1. A variable resistive film attenuator of the type having a constant characteristic impedance into and out of the attenuator, comprising:
    an input connector for receiving an attenuable signal;
    an output connector for providing an attenuated signal, said output connector and said input connector having a length therebetween physically maintained constant for all attenuation values;
    a transmission line means disposed between both of said input and output connectors, said transmission line of the type having a grounded outer conductor and an inner conductor with a resistive film attenuator portion laying on an insulating support member, said portion including a series resistance film portion, shunt resistive film portions in correspondence with and extending away from said series resistance film portion and means for selectively connecting the extending shunt resistive film portion to said outer conductor; and
    means for moving said attenuator portion between said input and output connectors to change the attenuation values of the attenuator.

2. The attenuator according to claim 1 wherein said means for moving said attenuator portion between said input and output connectors to change the attenuation values of the attenuator defines a means for moving said attenuator portion relative to said transmission line means.

3. The attenuator according to claim 1 wherein said means for selectively connecting the extending shunt resistive film portion comprises an array of individual conductive spring elements in adjustable contact with said shunt resistive portion.

4. The attenuator according to claim 3 wherein said array of individual conductive spring elements in adjustable contact with said shunt resistive portion provides minute adjustment of the attenuator.

5. A variable resistive film attenuator of the type having a constant characteristic impedance into and out of the attenuator, comprising:
    an input connector for receiving an attenuable signal;
    an output connector for providing an attenuated signal, said output connector and said input connector having a length therebetween physically maintained constant for all attenuation values;
    a transmission line means disposed between both of said input and output connectors, said transmission line of the type having a grounded outer conductor and an inner conductor with a resistive film attenuator portion lying on a flat, circular insulating support member, said portion including a series resistive film portion, a shunt resistive film portion in correspondence with and extending away from said series resistive film portion and means for selectively connecting the extending shunt resistive film portion to said outer conductor; and
    means for moving said attenuator portion between said input and output connectors to change the attenuation value of the attenuator.

6. The attenuator according to claim 5 wherein said means for moving said attenuator portion between said input and output connectors to change the attenuation values of the attenuator defines a means for moving said attenuator portion relative to said transmission line means.

7. The attenuator according to claim 5 wherein said means for selectively connecting the extending shunt resistor film portion comprises an array of individual conductive spring elements in adjustable contact with said shunt resistive portion.

8. The attenuator according to claim 7 wherein said array of individual conductive spring elements in adjustable contact with said shunt resistive portion provides minute adjustment of the attenuator.

* * * * *